United States Patent
Kim

(10) Patent No.: US 8,669,598 B2
(45) Date of Patent: Mar. 11, 2014

(54) UNIT PIXEL OF IMAGE SENSOR AND PHOTO DETECTOR THEREOF

(71) Applicant: Hoon Kim, Seoul (KR)

(72) Inventor: Hoon Kim, Seoul (KR)

( * ) Notice: Subject to any disclaimer, the term of this patent is extended or adjusted under 35 U.S.C. 154(b) by 0 days.

(21) Appl. No.: 14/036,022

(22) Filed: Sep. 25, 2013

(65) Prior Publication Data

US 2014/0021519 A1  Jan. 23, 2014

Related U.S. Application Data

(62) Division of application No. 13/224,921, filed on Sep. 2, 2011, now Pat. No. 8,569,806.

(51) Int. Cl.
   *H01L 27/148* (2006.01)
   *H01L 21/00* (2006.01)

(52) U.S. Cl.
   USPC ............ 257/225; 257/24; 257/30; 257/222; 257/290; 257/431; 257/432; 257/E21.131; 257/E21.151; 257/E27.151; 438/28; 438/48; 438/57; 250/370.09

(58) Field of Classification Search
   USPC ............ 257/24, 30, 222, 225, 290, 431, 432, 257/E21.131, E21.151, E27.151; 438/28, 438/48, 57; 250/370.09
   See application file for complete search history.

(56) References Cited

U.S. PATENT DOCUMENTS

| | | | |
|---|---|---|---|
| 7,196,312 B2 * | 3/2007 | Shizukuishi | 250/214.1 |
| 7,271,430 B2 * | 9/2007 | Park et al. | 257/225 |
| 2004/0217262 A1 | 11/2004 | Lee | |
| 2009/0032852 A1 | 2/2009 | Song et al. | |
| 2009/0101915 A1 | 4/2009 | Weng et al. | |
| 2009/0256176 A1 * | 10/2009 | Kobayashi et al. | 257/225 |
| 2009/0302358 A1 * | 12/2009 | Mao et al. | 257/292 |
| 2010/0073538 A1 | 3/2010 | Cieslinski | |
| 2013/0146747 A1 * | 6/2013 | Hynecek | 250/208.1 |

* cited by examiner

*Primary Examiner* — Dao H Nguyen
(74) *Attorney, Agent, or Firm* — McKenna, Long & Aldridge, LLP.

(57) ABSTRACT

A unit pixel of an image sensor and a photo detector are disclosed. The photo detector of the present invention configured to absorb light can include: a light-absorbing part configured to absorb light by being formed in a floated structure; an oxide film being in contact with one surface of the light-absorbing part; a source being in contact with one side of the other surface of the oxide film and separated from the light-absorbing part with the oxide film therebetween; a drain facing the source so as to be in contact with the other side of the other surface of the oxide film and separated from the light-absorbing part with the oxide film therebetween; and a channel interposed between the source and the drain and configured to form flow of an electric current between the source and the drain.

8 Claims, 14 Drawing Sheets

UNIT PIXEL OF IMAGE SENSOR AND PHOTO DETECTOR THEREOF

This application is a divisional of Ser. No. 13/224,921, filed Sep. 2, 2011, which is incorporated herein by reference.

BACKGROUND

1. Field of the Invention

Embodiments of the present invention relate to a unit pixel of an image sensor and a photo detector of the unit pixel.

2. Description of the Related Art

An image sensor is a sensor that transforms an optical signal to an electrical image signal. When light is irradiated to a light-absorbing part inside a unit pixel of an image sensor chip, the image sensor detects the light incident at each unit pixel and the amount of the light and transforms an optical signal to an electrical signal and then transfers the electrical signal to analog and digital circuits for forming an image.

The conventional image sensors can be classified into CCD (Charge Coupled Device) types and CMOS (Complementary Metal Oxide Semiconductor) types, based on their structures and operation principles. The CMOS type image sensors are commonly referred to as CIS (CMOS Image Sensor).

In the CCD type image sensor, groups of signal electrons generated at the pixels by the light are transmitted to an output unit by a pulse applied to a gate, transformed to voltages of the output unit, and sent out one by one.

In the CMOS type image sensor, the signal electrons and holes that are generated at the pixels by the light are transformed to voltages inside the pixels. These voltages are connected to a signal processor, including a row decoder and a column decoder, and sent out of the pixels by a switching operation according to a clock frequency.

The image sensor can be either an APS (Active Pixel Sensor) or a PPS (Passive Pixel Sensor), according to the presence of an amplifier in the unit pixel.

The PPS is a passive device that does not encompass a signal amplification function inside the pixel, and outputs the electric current of the device to the outside to transform the electric current to a voltage outside the pixel. On the other hand, the APS is an active device that encompasses a signal amplification function inside the pixel.

The PPS is mostly constituted with one photo diode and one select transistor, and thus not only can have a greater aperture ratio than the APS, which requires 3-MOS transistors for the same sized pixel, but also can raise a fill factor related to a light-absorbing efficiency.

However, since the intensity of photoelectric current of the photo diode is not great and an optical signal is transformed to electric current that is vulnerable to an outside environment for use in signal processing, the PPS has a problem of fixed pattern noise (FPN).

Therefore, for the same size pixel, the APS can provide an image signal that has relatively less noise than the PPS, despite the smaller size of the light-absorbing part than the PPS, since a multiple number of transistors are present in the unit pixel.

One electron-hole pair (EHP) is generated for one photon that is incident at a unit pixel light-absorbing part of an image sensor, and the generated electrons and holes are accumulated in a photo diode, which is a light-absorbing part.

The maximum accumulation electrostatic capacity of a photo diode is proportional to the area of photo detection of the photo diode. Particularly, in the case of CMOS type image sensor, the area in which the accompanying transistors are arranged is larger than that of the CCD type image sensor, and thus increasing the area of the light-absorbing part is physically limited. Moreover, the photo diode, which is commonly used as the light-absorbing part of an image sensor, has relatively small electrostatic capacity and thus is easily saturated, and it is difficult to segment the signals generated by the light-absorbing part.

Therefore, the unit pixels of the CMOS image sensor require a relatively long photoelectric charge accumulation time in order to generate a minimum electric charge for signal processing through the limited photo detection area. Accordingly, it is not easy to manufacture a high-density/high-speed frame image sensor by using the unit pixels having this kind of light-absorbing part.

The band gap of a silicon semiconductor is 1.12 eV, and a photo detector made of a silicon semiconductor can detect light energy in wavelengths of 350 nm to 1150 nm. Here, since the light has different inherent energy per wavelength and has different depth of penetration when the light penetrates silicon, which is solid, the photoelectric efficiency for each wavelength is also different at the photo detector. In order to detect the wavelengths of visible rays (400-700 nm), the image sensor forms an interface of P-N junction so that a green ray, which commonly has energy in the wavelength of 550 nm, can be better detected. Therefore, in the image sensor having this structure, photoelectric efficiencies for a short wavelength, such as blue color, and a long wavelength of a near infrared ray are deteriorated, or the optical signal is transformed to a noise.

Prior arts related to an image sensor and a unit pixel of an image sensor include U.S. Publication Number 2004/0217262 ("UNIT PIXEL IN CMOS IMAGE SENSOR WITH HIGH SENSITIVITY"), U.S. Publication Number 2009/0032852 ("CMOS IMAGE SENSOR") and U.S. Publication Number 2010/0073538 ("IMAGE SENSOR").

U.S. Publication Number 2004/0217262 discloses an image sensor that includes one photo diode and four transistors of a transfer transistor, a reset transistor, a drive transistor and a selection transistor and that inhibits the drive transistor and the selection transistor from being affected by leakage of a power supply voltage (VDD) by separating an active area in which the drive transistor and the selection transistor are formed from an active area in which the reset transistor is formed.

However, since U.S. Publication Number 2004/0217262 integrates the photo diode and the four transistors in a limited area, it is difficult to provide an area of the photo diode for generating a sufficient quantity of electric charge for signal processing.

U.S. Publication Number 2009/0032852 discloses an image sensor that can acquire a wide dynamic range without the loss of sensitivity, by allowing a pixel constituting a CMOS image sensor to have a plurality of floating diffusion regions.

The CMOS image sensor of U.S. Publication Number 2009/0032852 acquires a final image by acquiring and synthesizing a signal, of which the sensitivity is low but the dynamic range for the brightness is wide, and a signal, of which the dynamic range for the brightness is narrow but the sensitivity is high, in a separate floating diffusion region.

However, since the above CMOS image sensor acquires the high-sensitivity signal and the wide dynamic range signal using the respective separate floating diffusion regions and their related transistors, it is difficult to provide a sufficient region for a photo detector.

U.S. Publication Number 2010/0073538 discloses an image sensor having a high photoconductivity. However, the image sensor of U.S. Publication Number 2010/0073538 forms an additional film layer over a PN junction in order to increase the photoconductivity of a PN junction diode, and thus requires an additional manufacturing process.

SUMMARY

Contrived to solve the above problems, embodiments of the present invention provide a unit pixel of a high-sensitivity/high-performance image sensor and a photo detector of the unit pixel that can output a great photoelectric current with a small quantity of light, realize a high-speed frame operation in an environment of low level of illumination, and record a video ranging from low to high levels of illumination in a same screen.

An aspect of the present invention features a photo detector configured to absorb light in a unit pixel of an image sensor transforming the absorbed light to an electrical signal, which can include: a light-absorbing part configured to absorb light by being formed in a floated structure; an oxide film being in contact with one surface of the light-absorbing part; a source being in contact with one side of the other surface of the oxide film and separated from the light-absorbing part with the oxide film therebetween; a drain facing the source so as to be in contact with the other side of the other surface of the oxide film and separated from the light-absorbing part with the oxide film therebetween; and a channel interposed between the source and the drain and configured to form flow of an electric current between the source and the drain. The light-absorbing part can be doped with first type impurities, and the source and the drain can be doped with second type impurities. The light-absorbing part can be insulated from the source and the drain by the oxide film. Electrons of electron-hole pairs generated by the absorbed light can be moved to the source and the drain by a tunneling phenomenon occurred by an electric field concentrated in the oxide film, and the flow of the electric current of the channel can be controlled by a change in the quantity of electric charge of the light-absorbing part caused by the moving of the electrons.

The channel can be formed in a state immediately before pinch-off by adjusting a W/L ratio, which is a ratio between a width (W) and a length (L) of the channel.

The tunneling phenomenon can be occurred in an area between one of the source and drain and the light-absorbing part.

The source and the drain can be formed by doping the second type impurities in a body, and the body can be floated.

A threshold voltage of the photo detector can be changed due to the tunneling phenomenon occurred in the oxide film.

The photo detector can also include a light-blocking layer configured to block absorption of light in areas other than an upper surface of the light-absorbing part.

Another aspect of the present invention features a unit pixel of an image sensor configured to transform absorbed light to an electrical signal, which can include: a photo detector configured to cause an electric current to flow using a change in the quantity of electric charge caused by incident light; and a select device configured to output the electric current generated by the photo detector to a unit pixel output terminal. The photo detector can include: a light-absorbing part formed in a floated structure and configured to absorbed light; an oxide film being in contact with one surface of the light-absorbing part; a source being in contact with one side of the other surface of the oxide film and separated from the light-absorbing part with the oxide film therebetween; a drain facing the source so as to be in contact with the other side of the other surface of the oxide film and separated from the light-absorbing part with the oxide film therebetween; and a channel formed between the source and the drain and configured to form flow of an electric current between the source and drain. The select device can include: a drain being connected with the source of the photo detector; a source being accessed to the unit pixel output terminal; and a gate configured to receive a control signal from an outside, and a switching operation can be performed based on the control signal. The light-absorbing part can be doped with first type impurities, and the source and the drain the photo detector can be doped with second type impurities. The light-absorbing part can be insulated from the source and the drain of the light-absorbing part by the oxide film. Electrons of electron-hole pairs generated by the absorbed light can be moved to the source and the drain by a tunneling phenomenon occurred by an electric field concentrated in the oxide film, and the flow of the electric current of the channel can be controlled by a change in the quantity of electric charge of the light-absorbing part caused by the moving of the electrons.

The photo detector can be realized in an LDD (light doped drain) structure.

The source of the photo detector and the drain of the select device can be formed in a same active area.

Yet another aspect of the present invention features a photo detector configured to absorb light in a unit pixel of an image sensor for converting the absorbed light to an electrical signal, which can include: a light-absorbing part configured to absorb light by being formed in a floated structure; an oxide film being in contact with one surface of the light-absorbing part; a control terminal formed on the other surface of the light-absorbing part and configured to transfer a reset signal to the light-absorbing part; a source being in contact with one side of the other surface of the oxide film and separated from the light-absorbing part with the oxide film therebetween; a drain facing the source so as to be in contact with the other side of the other surface of the oxide film and separated from the light-absorbing part with the oxide film therebetween; and a channel interposed between the source and the drain and configured to form flow of an electric current between the source and the drain. The light-absorbing part can be doped with first type impurities, and the source and the drain are doped with second type impurities. The light-absorbing part can be insulated from the source and the drain by the oxide film. Electrons of electron-hole pairs generated by the absorbed light can be moved to the source and the drain by a tunneling phenomenon occurred by an electric field concentrated in the oxide film, and the flow of the electric current of the channel can be controlled by a change in the quantity of electric charge of the light-absorbing part caused by the moving of the electrons. The control terminal can move remaining electric charge by transmitting the reset signal to the light-absorbing part.

The channel can be formed in a state immediately before pinch-off by adjusting a W/L ratio, which is a ratio between a width (W) and a length (L) of the channel.

The tunneling phenomenon can be occurred in an area between one of the source and drain and the light-absorbing part.

The source and the drain can be formed by doping the second type impurities in a body, and the body can be floated.

A threshold voltage of the photo detector can be changed due to the tunneling phenomenon occurred in the oxide film.

The photo detector can also include a light-blocking layer configured to block absorption of light in areas other than an upper surface of the light-absorbing part.

Still another aspect of the present invention features a unit pixel of an image sensor configured to transform absorbed light to an electrical signal, which can include: a photo detector configured to cause an electric current to flow using a change in the quantity of electric charge caused by incident light; and a select device configured to output the electric current generated by the photo detector to a unit pixel output terminal. The photo detector can include: a light-absorbing part configured to absorb light by being formed in a floated structure; an oxide film being in contact with one surface of the light-absorbing part; a control terminal formed on the other surface of the light-absorbing part and configured to transfer a reset signal to the light-absorbing part; a source being in contact with one side of the other surface of the oxide film and separated from the light-absorbing part with the oxide film therebetween; a drain facing the source so as to be in contact with the other side of the other surface of the oxide film and separated from the light-absorbing part with the oxide film therebetween; and a channel interposed between the source and the drain and configured to form flow of an electric current between the source and the drain. The select device can include: a drain being connected with the source of the photo detector; a source being accessed to the unit pixel output terminal; and a gate configured to receive a control signal from an outside, and a switching operation can be performed based on the control signal. The light-absorbing part can be doped with first type impurities, and the source and the drain the photo detector can be doped with second type impurities. The light-absorbing part can be insulated from the source and the drain of the light-absorbing part by the oxide film. Electrons of electron-hole pairs generated by the absorbed light can be moved to the source and the drain by a tunneling phenomenon occurred by an electric field concentrated in the oxide film, and the flow of the electric current of the channel is controlled by a change in the quantity of electric charge of the light-absorbing part caused by the moving of the electrons. The control terminal can move remaining electric charge by transmitting the reset signal to the light-absorbing part.

The photo detector can be realized in an LDD (light doped drain) structure.

The source of the photo detector and the drain of the select device can be formed in a same active area.

The unit pixel can also include a second photo detector serially connected with the photo detector and the select device and formed in a same structure as the photo detector.

The unit pixel can also include a second photo detector connected in parallel with the photo detector and formed in a same structure as the photo detector.

DETAILED DESCRIPTION

Since there can be a variety of permutations and embodiments of the present invention, certain embodiments will be illustrated and described with reference to the accompanying drawings. This, however, is by no means to restrict the present invention to certain embodiments, and shall be construed as including all permutations, equivalents and substitutes covered by the ideas and scope of the present invention.

Throughout the description of the present invention, when describing a certain technology is determined to evade the point of the present invention, the pertinent detailed description will be omitted. Terms such as "first" and "second" can be used in describing various elements, but the above elements shall not be restricted to the above terms. The above terms are used only to distinguish one element from the other.

When one element is described as being "connected" or "accessed" to another element, it shall be construed as being connected or accessed to the other element directly but also as possibly having another element in between. On the other hand, if one element is described as being "directly connected" or "directly accessed" to another element, it shall be construed that there is no other element in between.

Hereinafter, certain embodiments of the present invention will be described with reference to the accompanying drawings.

Figure 1:
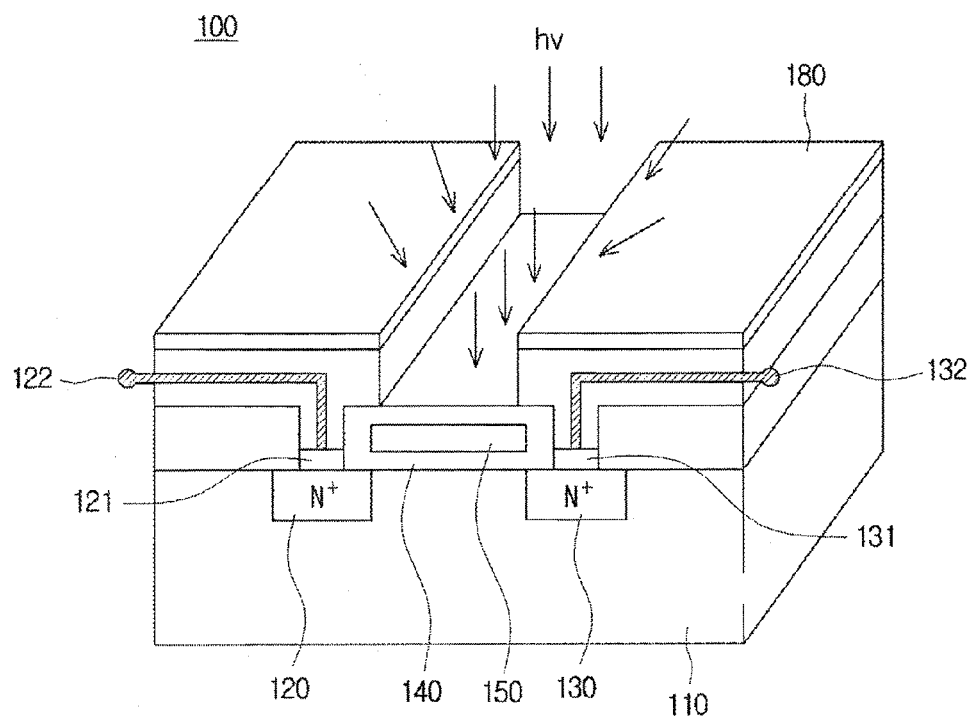
FIG. 1 is a perspective view of a tunnel junction photo detector in accordance with a first embodiment of the present invention.

FIG. 1 is a perspective view of a tunnel junction photo detector in accordance with a first embodiment of the present invention. As illustrated in FIG. 1, a photo detector of a unit pixel is realized using a tunnel junction instead of the conventional photo diode. Here, a tunnel junction device, in which a thin insulation layer is joined in between two conductors or semiconductors, refers to a device that operates using a tunneling effect generated in the insulation layer. For reference, the tunneling effect is a quantum mechanical phenomenon in which a particle passes through an area having a greater potential energy than its inherent dynamic energy under a strong electric field.

In an embodiment of the present invention, the photo detector of a unit pixel can be generated using said tunnel junction device, and the "tunnel junction photo detector" in the description and claims of the present invention refers to a photo detector realized using said tunnel junction device. The tunnel junction photo detector can be realized using various kinds of structures, for example, the general n-MOSFET or p-MOSFET structure. Also, in addition to MOSFET, the unit pixel can be realized using an electronic device having a structure that can provide a tunneling effect, for example, JFET, HEMT, etc.

In FIG. 1, a tunnel junction photo detector 100 is realized in an NMOS structure. The tunnel junction photo detector 100 is formed on a p-type substrate 110 and includes an N+ diffusion layer 120 corresponding to a source and an N+ diffusion layer 130 corresponding to a drain in a general NMOS electronic device. Hereinafter, the N+ diffusion layers 120, 130 will be referred to as the "source" and "drain" in the tunnel junction photo detector, respectively.

Formed in between the source 120 and the drain 130 is a thin oxide film 140, and formed above the oxide film 140 is a poly-silicon 150, in which a p-type impurity is doped, corresponding to the gate in the NMOS structure. Here, in order to facilitate the tunneling phenomenon, it is preferable that the oxide film 140 is formed in the thickness of 10 nm or less, for example, 2 nm, 5 nm, 7 nm, etc.

Unlike a gate in a general NMOS electronic device, the poly-silicon 150 is formed in a floated structure. In addition, the poly-silicon 150 does not form a silicide layer above the poly-silicon 150 and operates as an area that absorbs light. If a silicide layer is formed over the poly-silicon 150, metallic impurities make it difficult for electron-hole pairs to be formed by the light and for the light to permeate into the poly-silicon 150 because the incident light is reflected.

Hereinafter, an area of the poly-silicon 150 of the tunnel junction photo detector 100 in the description and claims of the present invention will be referred to as a "light-absorbing part."

Formed above the source 120 and the drain 130 are metal contacts 121, 131 that are respectively connected with outside nodes. The metal contact 121 of the source 120 is connected with an outside through a metal line 122, and the metal contact 131 of the drain 130 is likewise connected with an outside through a metal line 132.

The tunnel junction photo detector 100 is formed in a structure in which the p-type substrate 110 is floated, unlike the general NMOS electronic device. Accordingly, the tunnel junction photo detector 100 is different in structure from the general NMOS electronic device in that only the source 120 and the drain 130 are connected with the outside nodes.

Moreover, the tunnel junction photo detector 100 can be formed symmetrically. Accordingly, it is possible that the source 120 and the drain 130 are substituted with each other.

Figure 5:
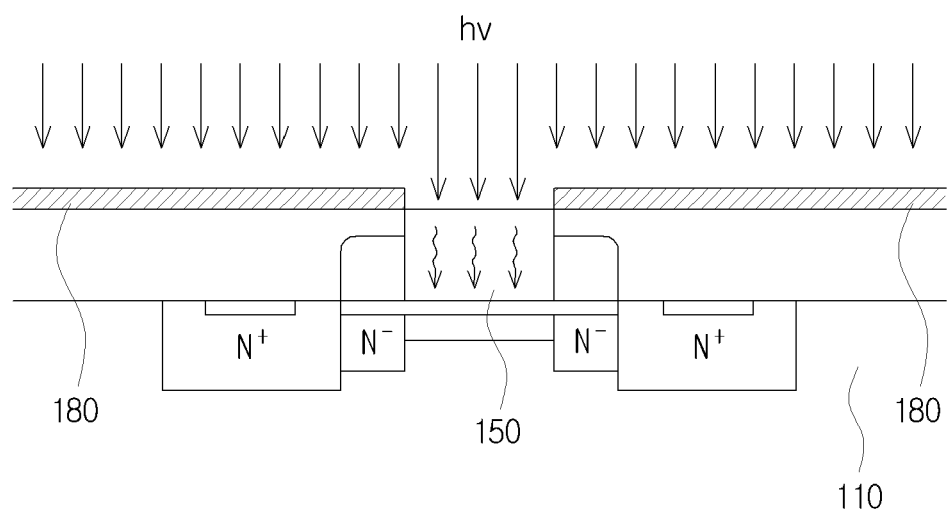
FIG. 5 is a cross-sectional view for illustrating a light-blocking method of the tunnel junction photo detector in accordance with the first embodiment of the present invention.

An upper part of the photo detector 100 excluding an upper surface of the light-absorbing part 150 has a light-blocking layer 180 formed thereon. Referring to FIG. 5, the light-blocking layer 180 blocks the light from being absorbed in areas other than the light-absorbing part 150, by being formed on an upper part of the tunnel junction photo detector 100 excluding the upper surface of the light-absorbing part 150. This is to efficiently tunnel photoelectric charges of the light-absorbing part 150. Moreover, this is to inhibit parasitic electric charges from being generated by the absorption of light in areas other than the light-absorbing part 150 as well as to obtain controlled photoelectric current. The light-blocking layer 180 can be formed through a silicide process and can be prevented from being formed over the light-absorbing part 150 through the use of a mask.

Figure 2:
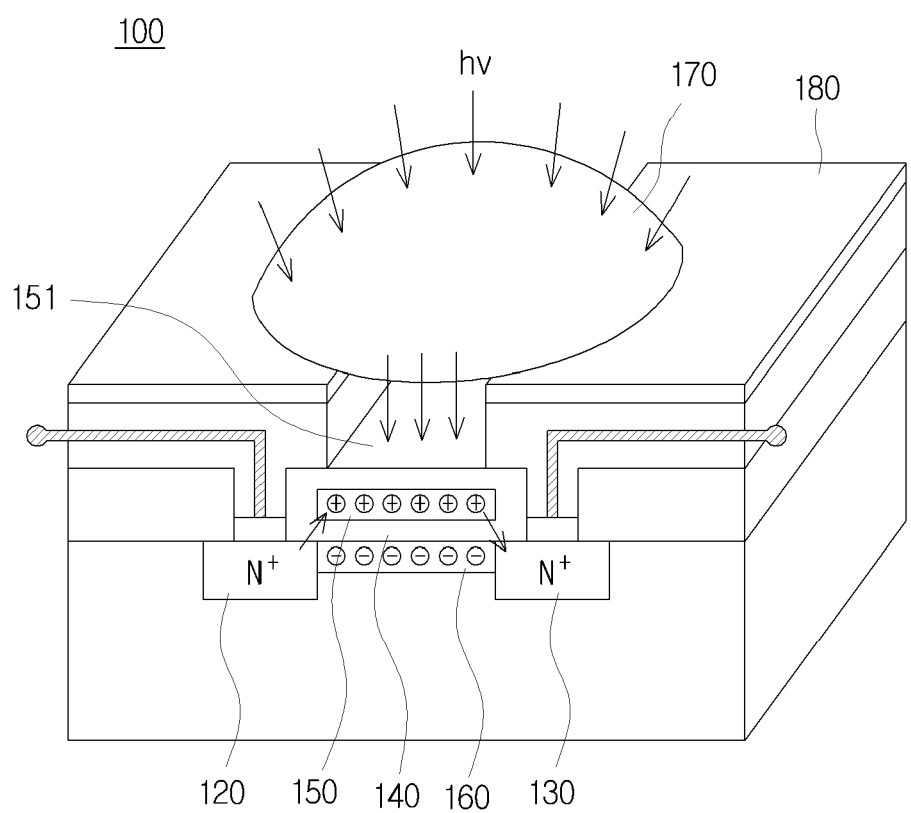
FIG. 2 is another perspective view of the tunnel junction photo detector in accordance with the first embodiment of the present invention.

FIG. 2 illustrates a photo detector having a micro lens.

In FIG. 2, a micro lens 170 converges light incident to the photo detector 100. In a common image sensor, the light is incident at the image sensor through an optical lens (not shown). The light having passed the optical lens arrives at the micro lens 170 located above the photo detector 100. The micro lens 170 converges the light incident the light incident at a front surface of the unit pixel and allows the incident light to enter an upper surface 151 of the light-absorbing part 150. Here, the upper surface 151 of the light-absorbing part 150 can be directly exposed, or a passivation layer, through which light can readily permeate, can be formed in between the light-absorbing part 150 and the air. The micro lens 170 is arranged above the light-absorbing part 150 where the light-blocking layer 180 is not formed in such a way that the light is converged.

An electric field is formed between the source 120 and drain 130 and the light-absorbing part 150 by the incident light, and a channel 160 is formed between the source 120 and the drain 130. Specifically, electron-hole pairs are generated by the light incident at the light-absorbing part 150, and electrons of the generated electron-hole pairs are moved to the source 120 or the drain 130 from the light-absorbing part 150 by a tunneling effect. Due to the loss of the electrons, the quantity of electric charge in the holes of the light-absorbing part 150 becomes relatively increased. Accordingly, unlike a common NMOS device, the channel 160 is formed and electric current becomes to flow between the source 120 and the drain 130 due to the effect of threshold voltage modulation caused by a change in the quantity of electric charge of the light-absorbing part 150.

Figure 3:
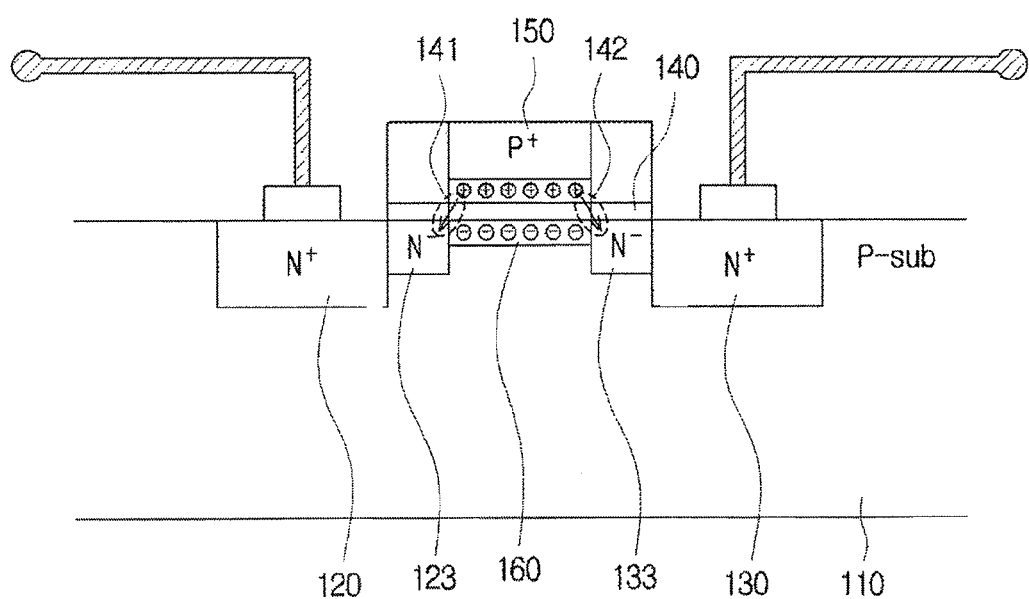
FIG. 3 is a cross-sectional view of the tunnel junction photo detector in accordance with the first embodiment of the present invention.

Meanwhile, the tunnel junction photo detector 100 can be realized in an LDD (light doped drain) structure. By realizing the tunnel junction photo detector in an LDD structure, it becomes possible to decrease the generation of a hot carrier caused by a short channel effect. FIG. 3 shows a cross-sectional view of the tunnel junction photo detector formed in an LDD structure in accordance with an embodiment of the present invention.

In FIG. 3, the tunnel junction photo detector 100 is formed on the p-type substrate 100 and includes the source 120 and the drain 130, both of which are N+ diffusion layers. Here, the source 120 and the drain 130 are symmetrical to each other and can have identical device properties. An LDD area 123, which is an n-type area that is lightly doped, is formed in an area that is adjacent to the source 120 and the oxide film 141. Moreover, an LDD area 123, which is an n-type area that is lightly doped, can be formed in an area that is adjacent to the drain 130 and the oxide film 140. The light-absorbing part 150 can be formed to have the same length as the distance between the LDD area 123 of the source 120 and the LDD area 133 of the drain 130.

When light having greater energy than energy to which doped impurities are coupled is irradiated to the light-absorbing part 150, light having greater energy than coupling energy of the doped holes is incident at the light-absorbing part 150, which is poly-silicon in which p-type impurities are doped, the plurality of holes formed by doping the impurities become a free state within a boundary defined by the oxide film 140, which prevents the electric charge from moving in an equilibrium state. Here, the generated electron-hole pairs are present in the states of electrons and holes for a predetermined duration until they are recombined, increasing the number of holes locally and thus increasing the quantity of electric charge.

The separated electrons freely move outside a grain boundary of the poly-silicon. Here, if an outside voltage is supplied to the drain 130, the electrons are pulled to near an edge of the LDD area 133 of the drain. Accordingly, the electrons are accumulated near the edge of the light-absorbing part 150 that is adjacent to the LDD area 133 and receive the electric field. The electric field that is relatively stronger is formed as the number of integrated electrons increases. Accordingly, the phenomenon of integration of electrons near the edge of the light-absorbing part 150 becomes accelerated. The more intense the light irradiated to the light-absorbing part 150 is, the more electron-hole pairs are formed and the greater electric field is formed.

The tunneling phenomenon occurs readily at a boundary area 141 where the distance between the LDD areas 123 and the light-absorbing part 150 is the shortest and at a boundary area 142 where the distance between the LDD areas 133 and the light-absorbing part 150 is the shortest. A tunneling effect occurs while energy level conditions are satisfied in the boundary areas 141, 142. By the tunneling effect, the electrons integrated in the boundary areas 141, 142 of the light-absorbing part 150 can be moved to the source 120 or the drain 130. In such a case, the total quantity of electric charge of the light-absorbing part 150 is changed. That is, the quantity of electric charge of the holes is increased by as much as the number of electrons lost by the tunneling effect, and the channel 160 is formed between the source 120 and the drain 130 due to the effect of threshold voltage modulation caused by a change of potential of the light-absorbing part 150. The quantity of electric current is increased through the formed channel 160.

Meanwhile, if the intensity of light becomes smaller or the light is blocked, the quantity of electric charge returns to its original state, in an opposite way to the above phenomenon. In case the light is intensely irradiated and then blocked, the light-absorbing part 150 becomes to have a quantity of weak (+) electric charge due to the increase in the quantity of electrons, but an electric field is formed by the electrons accumulated in the boundary area 142 of the LDD area 133 of the drain and the boundary area 141 of the LDD area 123 of the source, in which electric potentials are relatively low. Afterwards, the tunneling effect occurs in the boundary areas 141, 142 in directions the electrons flowing into the light-absorbing part 150. When the electrons flowed in by the tunneling effect are recombined with the holes, the quantity of (+) electric charge becomes decreased. This will weaken the electric field by the light-absorbing part 150, and reduce or eliminate the channel 160 between the source 120 and the drain 130. Accordingly, the electric current flowing through the channel 160 stops flowing.

Figure 4:
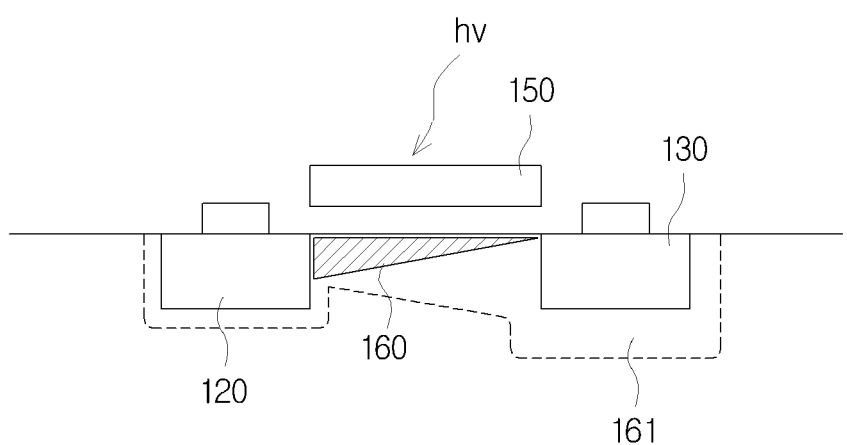
FIG. 4 is a cross-sectional view for illustrating the forming of a channel of the tunnel junction photo detector in accordance with the first embodiment of the present invention.

The channel 160 is designed in a manufacturing process of the tunnel junction photo detector 100 in such a way that the channel 160 is in a state immediately before pinch-off. FIG. 4 shows the channel 160 of the present invention. In FIG. 4, the channel 160 is generated by a voltage difference between the source 120 and the drain 130. Moreover, a depletion layer 161 is formed around the source 120, the drain 130 and the channel 160 due to the supplied voltage. The channel 160 is manufactured by adjusting a W/L ratio, which is a ratio between its width and length, in the manufacturing process so that the channel 160 is in the state immediately before pinch-off while no outside voltage is supplied to the source 120 and the drain 130. Here, the W/L can be designed experimentally for each manufacturing process of the tunnel junction photo detector since the conditions in which pinch-off occurs can be different for each doping concentration of an element and each property of the tunnel junction photo detector.

The tunneling phenomenon occurs continuously in the boundary area 141, 142 between the LDD areas of the source 120 and drain 130 and the light-absorbing part 150. However, tunneling is more prominent in the side of the drain 130 when the intensity of light is greater, and in the side of the source 120 when the intensity of light is smaller, thereby maintaining the state of equilibrium.

Figure 6:
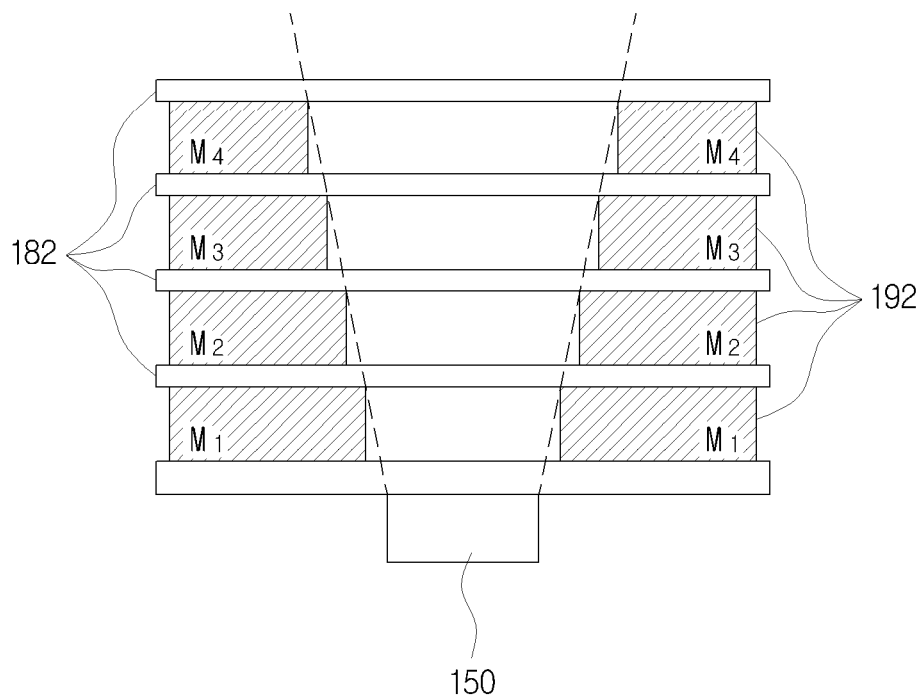
FIG. 6 is a cross-sectional view for illustrating an incident angle of light of the tunnel junction photo detector in accordance with the first embodiment of the present invention.

FIG. 6 is a cross-sectional view for illustrating an incident angle of light of a tunnel junction photo detector in accordance with a first embodiment of the present invention.

In FIG. 6, the light converged through the micro lens is incident to the light-absorbing part 150 along a light incident path having a predetermined slope by multiple layers of shades 192. The shades 192 can be formed by appropriately arranging metal lines for signal transfer and device control along the incident path. Formed in between the multiple layers of shades 192 can be passivation layers 182, which can be formed with a material that has little reflection of the incident light.

Through the above structure of tunnel junction photo detector, it becomes possible to flow photoelectric currents that are hundreds to thousands times greater than the conventional photo diode. While the conventional photo diode distinguishes the brightness only by the quantity of electric charge accumulated in the electrostatic capacity, the change in the quantity of electric charge of the light-absorbing part caused by the light works as the electric field effect in the photo detector in accordance with an embodiment of the present invention, thereby controlling the electric current flow of the channel. Moreover, since the required electric charge can be infinitely supplied through the drain, a signal can be self-amplified in the photo detector. Therefore, it is possible to realize a unit pixel in a PPS structure, without introducing an additional signal amplification device. Of course, it is also possible to realize a unit pixel using the conventional APS method. In the present embodiment, however, the unit pixel is realized in the PPS structure using the tunnel junction photo detector, for the convenience of description and understanding.

Hereinafter, some embodiments of a unit pixel of an image sensor realized using the tunnel junction photo detector in accordance with the above embodiments will be described with reference to the accompanying drawings.

Figure 7:
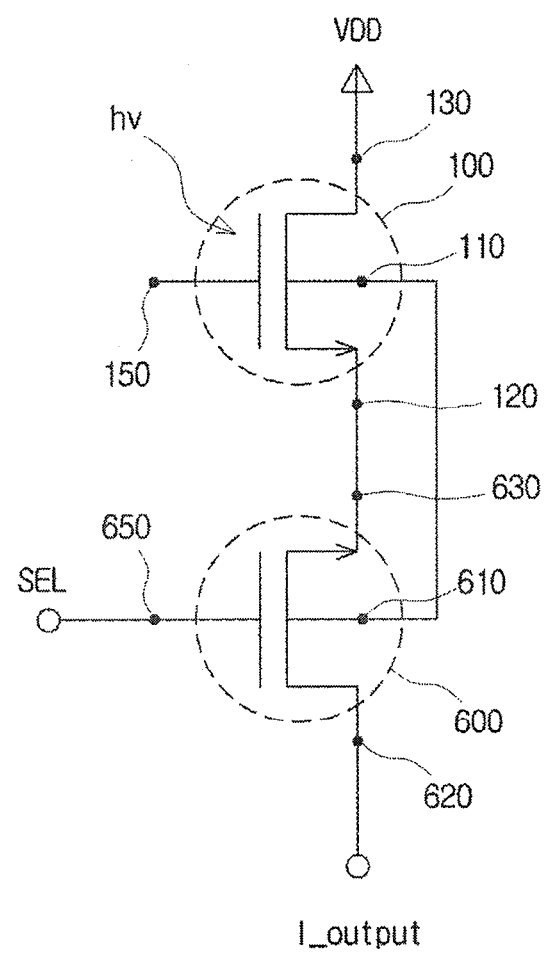
FIG. 7 is a circuit schematic of a unit pixel using the tunnel junction photo detector in accordance with the first embodiment of the present invention.

FIG. 7 is a circuit schematic of a unit pixel using the tunnel junction photo detector in accordance with the first embodiment of the present invention. The unit pixel shown in FIG. 7 includes one tunnel junction photo detector 100 and one select transistor 600.

Here, the one select transistor can be formed of various devices, for example, the conventional MOSFET structure. In this case, the tunnel junction photo detector and the select transistor can be simultaneously realized using a manufacturing process of the conventional MOSFET, simplifying the manufacturing process and saving the cost.

The drain 130 of the tunnel junction photo detector 100 is accessed to a power supply voltage (VDD), and the source 120 is connected to a drain 630 of the select transistor 600.

Although the source 120 and drain 130 of the tunnel junction photo detector 100 are symmetrical and identical to each other, the description and claims of the present specification will refer the drain as an area accessed to the power supply voltage (VDD) or an outside electric charge supply.

The light-absorbing part 150 of the tunnel junction photo detector 100 is formed in a floating gate structure that is restricted to allow light to incident at a gate only. The light-absorbing part 150 does not have metal silicide formed on an upper surface thereof, and thus it is possible to absorb the light through the light-absorbing part 150. A p-type substrate (P-sub), which corresponds to a body of a common NMOS structure, can be also formed in a floated structure. Therefore, the tunnel junction photo detector 100 is connected electrically with an outside node through the source 120 and the drain 130.

In the present embodiment, the select transistor 600 can be constituted with NMOS. The drain 630 of the select transistor 600 is connected to the source 120 of the tunnel junction photo detector 100, and a source 620 is connected to a unit pixel output terminal ("1_output"). A control signal ("Sx") for the control of on-off of the select transistor 600 can be supplied through a gate 650.

Moreover, a body 610 of the select transistor 600 can be formed in a floated structure, like the tunnel junction photo detector 100. This is floating a body 110 of the tunnel junction photo detector 100. In such a case, in the gate control of the select transistor 600 that is switch-operated, its switching function can be maintained by supplying a slightly higher voltage than the power supply voltage (VDD).

Figure 8:
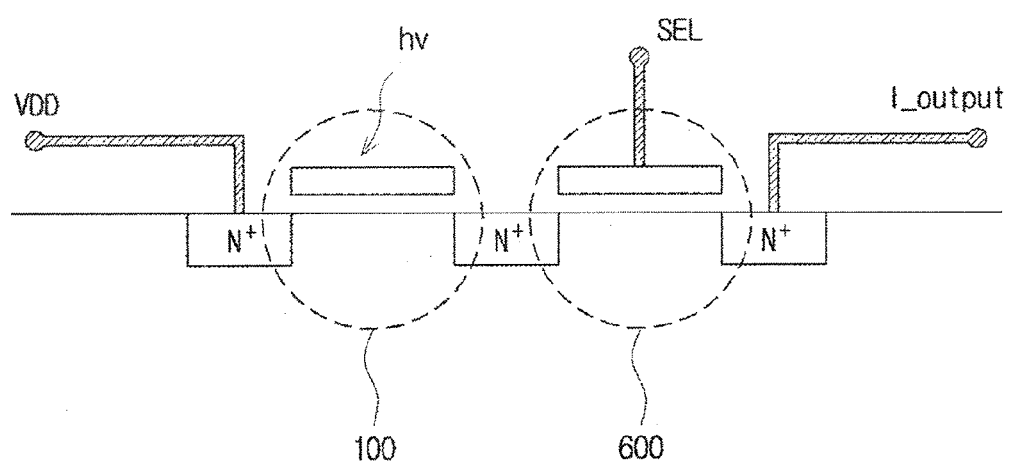
FIG. 8 is a cross-sectional view of the unit pixel using the tunnel junction photo detector in accordance with the first embodiment of the present invention.

FIG. 8 is a cross-sectional view of a unit pixel constituted with the tunnel junction photo detector and the select transistor in an NMOS structure in accordance with the first embodiment of the present invention.

As illustrated in FIG. 8, both the tunnel junction photo detector 100 and the select transistor 600 can be formed in a floated structure having the same P-sub as the body. In this case, the source 120 of the tunnel junction photo detector 100 and the drain 630 of the select transistor 600 can be formed in a same active area, simplifying the structure and reducing the size of the unit pixel.

Figure 9:
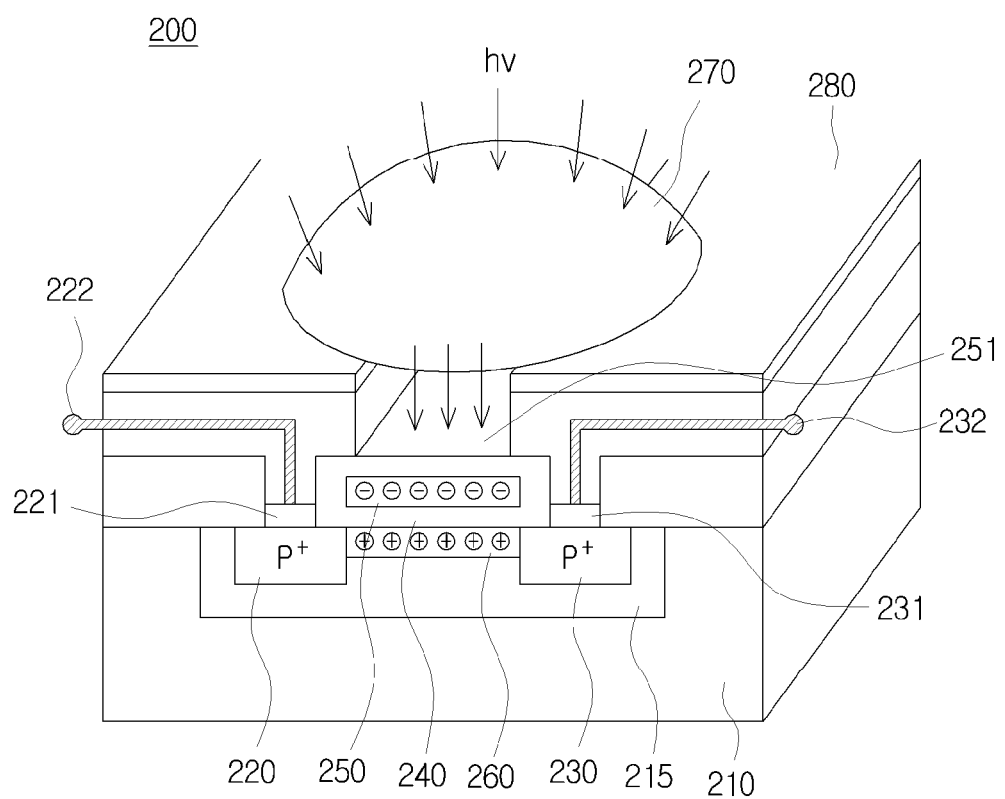
FIG. 9 is a perspective view of a tunnel junction photo detector in accordance with a second embodiment of the present invention.
Figure 10:
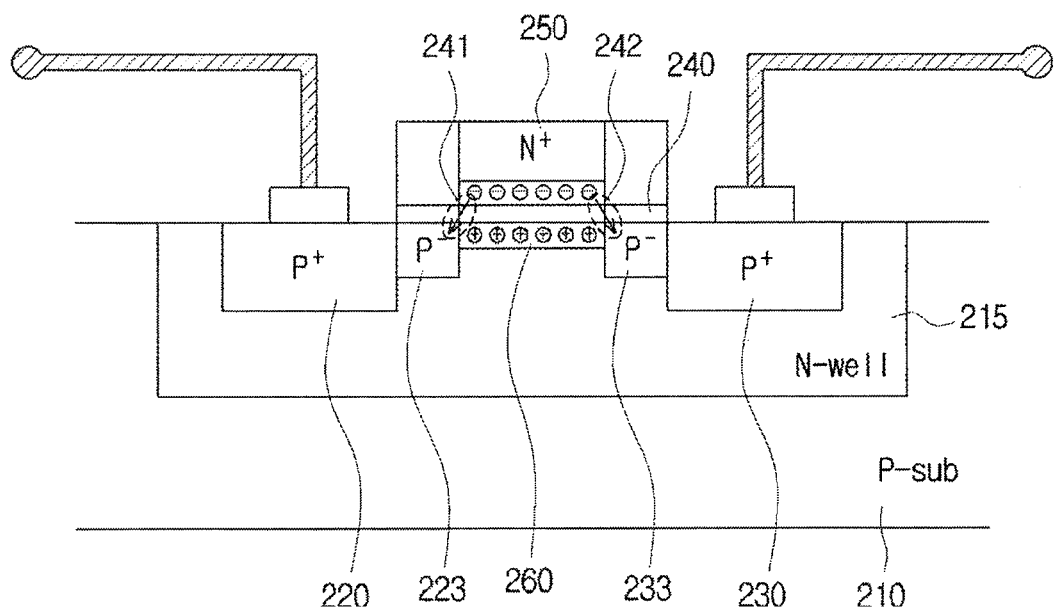
FIG. 10 is a cross-sectional view of the tunnel junction photo detector in accordance with the second embodiment of the present invention.

Hereinafter, a tunnel junction photo detector in accordance with a second embodiment of the present invention will be described. In FIG. 9, a tunnel junction photo detector 200 in accordance with a second embodiment of the present invention is realized in a PMOS structure. An N-well 215 is formed by injecting n-type impurities in a p-type substrate 210. A source 220 and a drain 230 are formed by injecting high-concentration p-type impurities in the formed N-well 215. A thin oxide film 240 is formed between the source 220 and the drain 230, and formed above the oxide film 240 is a light-absorbing part 250, which is formed in a floated structure. The light-absorbing part 250 can be poly-silicon in which n-type impurities are doped.

Like the first embodiment, the light-absorbing part 250 does not have a metallic silicide layer formed on an upper surface thereof, and functions as an area that absorbs light.

Formed above the source 220 and the drain 230 are metal contacts 221, 231 that are respectively connected with outside nodes. The metal contact 221 of the source 220 is connected with an outside through a metal line 222, and the metal contact 231 of the drain 230 is likewise connected with an outside through a metal line 232.

The N-well 215 is formed in a floated structure. Therefore, the tunnel junction photo detector is structurally different from a general PMOS electronic device in that only the source 220 and the drain 230 are connected with outside nodes.

An upper part of the photo detector 200 excluding the light-absorbing part 250 has a light-blocking layer 280 formed thereon. The light-blocking layer 280 blocks the light from being absorbed in areas other than the light-absorbing part 250.

A micro lens 270 converges the light incident at the tunnel junction photo detector 200 and guides the incident light to the light-absorbing part 250.

An electric field is formed between the source 220 and drain 230 and the light-absorbing part 250 by the incident light, and a channel 260 is formed between the source 220 and the drain 230.

Like the first embodiment, the tunnel junction photo detector 200 of the second embodiment can be realized in an LDD (light doped drain) structure. In this case, a tunneling phenomenon can occur readily at a boundary area 241 where the distance between an LDD area 223 and the light-absorbing part 250 is the shortest and at a boundary area 242 where the distance between an LDD area 233 and the light-absorbing part 250 is the shortest. A tunneling effect occurs while energy level conditions are satisfied in the boundary areas 241, 242. By realizing the tunnel junction photo detector in the above LDD structure, generation of hot carriers caused by a short channel effect can be reduced when a photoelectric current is generated by optical absorption, like in a common electronic device.

The tunnel junction photo detectors 100, 200 described above have a sensitivity property that is superbly higher than the conventional photo diode, and thus it is possible to manufacture a unit pixel that uses a much smaller area. By using this advantage, it is possible to integrate a plurality of tunnel junction photo detectors in a unit pixel.

Figure 11:
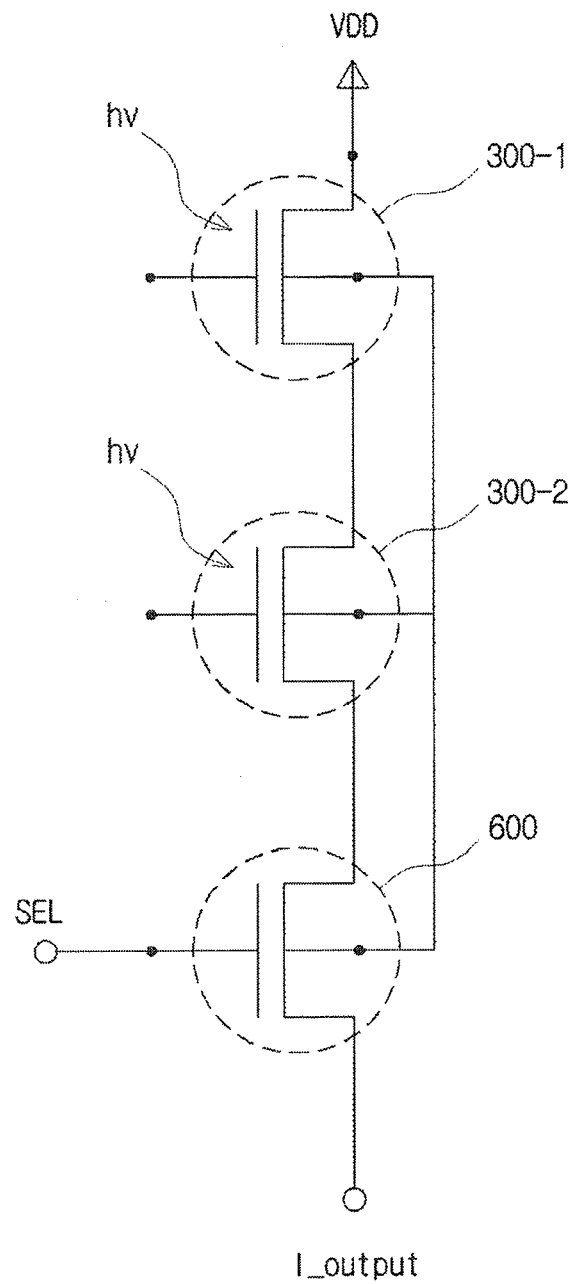
FIG. 11 is a circuit schematic of a unit pixel in which two tunnel junction photo detectors are serially connected in accordance with a third embodiment of the present invention.
Figure 12:
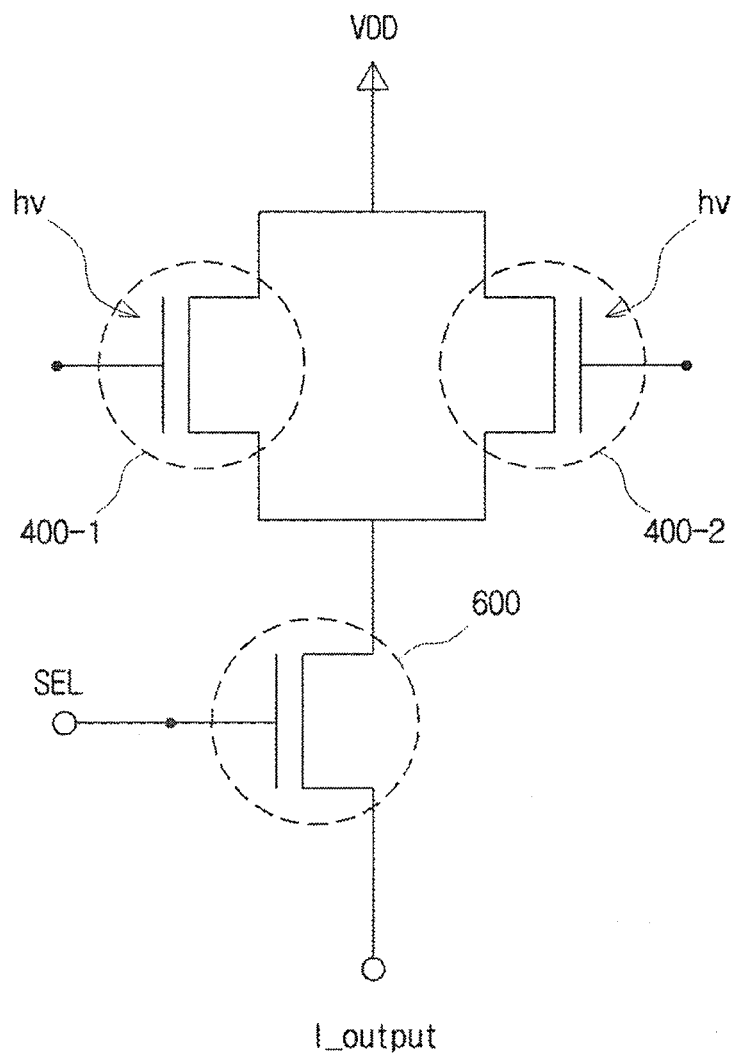
FIG. 12 is a circuit schematic of a unit pixel in which two tunnel junction photo detectors are connected in parallel in accordance with a fourth embodiment of the present invention.

FIG. 11 is a circuit schematic of a unit pixel in which two tunnel junction photo detectors are serially connected in accordance with a third embodiment of the present invention, and FIG. 12 is a circuit schematic of a unit pixel in which two tunnel junction photo detectors are connected in parallel in accordance with a fourth embodiment of the present invention.

In FIG. 11, two tunnel junction photo detectors 300-1, 300-2 are serially connected. In this case, the current flowing through the select transistor 600 to an output terminal ("1_output") is increased by nearly twice. Therefore, an ultra-high sensitivity effect, which can render a clear video in a low level of illumination of 0.1 lux or lower, is generated without adding an additional amplification circuit.

In FIG. 12, two tunnel junction photo detectors 400-1, 400-2 are connected in parallel. In this case, the voltage between the tunnel junction photo detectors 400-1, 400-2 connected parallel becomes twice greater. Moreover, it becomes possible to use one of the parallel connected tunnel junction photo detectors through a control of an operation circuit. Therefore, a dynamic range of the unit pixel can be selectively controlled, and a bright area and a dark area can be rendered in a much more improved manner.

Hereinafter, a tunnel junction photo detector in accordance with a fifth embodiment of the present invention will be described.

Figure 13:
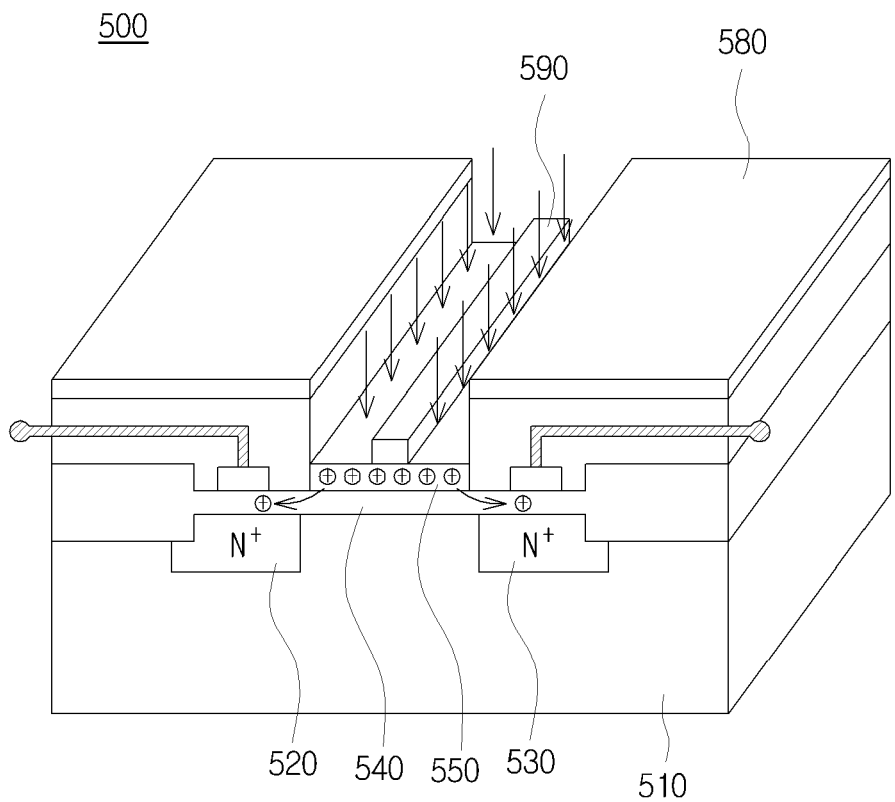
FIG. 13 is a perspective view of a tunnel junction photo detector in accordance with a fifth embodiment of the present invention.

In a tunnel junction photo detector 500 shown in FIG. 13, which has a similar structure as the tunnel junction photo detector 100 in accordance with the first embodiment of the present invention, a source 520, a drain 530 and a thin oxide layer 540, and a light-absorbing part 550, on which a light-blocking layer 580 is not formed, is formed above the oxide layer 540. The tunnel junction photo detector 500 also includes a select device 590, which is made of poly-silicon, on an upper surface of the light-absorbing part 500. The select device 590 can be formed to be in contact with an upper surface of the light-absorbing part 550, and an insulation layer can be interposed between the select device 590 and the light-absorbing part 550.

By supplying a predetermined voltage (e.g., 1.8V or 2.5V) to the light-absorbing part 550 through the select device 590, an electric charge remaining in the light-absorbing part 550 can be diffused or tunneled to the oxide layer 540. Resetting the remaining electric charge using this structure can fundamentally prevent an image lag from being generated and can provide an effect that is similar to an electronic shutter that can operate an image sensor in high speed more effectively. Here, if the select device 590 is formed on the upper surface of the light-absorbing part 550, the width of the light-absorbing part 550 excluding the area in which the select device 590 is formed needs to be greater than a wavelength of the light to be absorbed.

Figure 14:
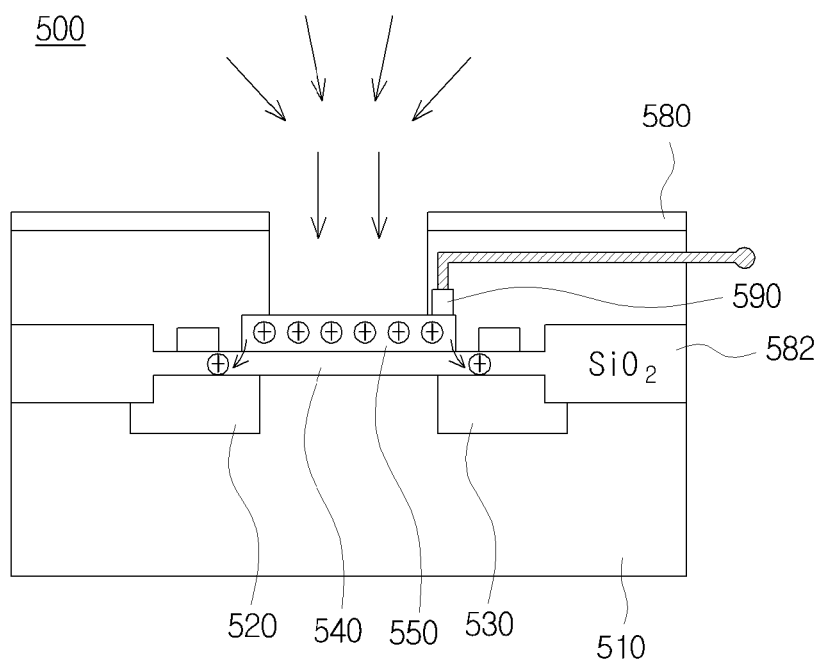
FIG. 14 is a cross-sectional view of the tunnel junction photo detector in accordance with the fifth embodiment of the present invention.

The select device 590 can be realized to be in contact with a location that is not the upper surface of the light-absorbing part 550, which absorbs the light. In FIG. 14, portions of the upper surface of the light-absorbing part 550 are configured to be blocked from an outside by an insulation layer or a light-blocking film 580. Here, the select device 590 can be formed to be in contact with a location of the light-absorbing part 550 that is covered. In this case, the area of the light-absorbing part 550 that absorbs the light can be amply provided.

Hitherto, the unit pixel of an image sensor as well as the tunnel junction photo detector of the unit pixel having the technical features of the present invention have been described through the above embodiments.

Through the above structure, it is possible that the unit pixel of the present invention allows hundreds to thousands times greater photoelectric currents than the conventional photo diode for a given quantity of light. This is because, unlike the conventional photo diode in which contrast is distinguished by the quantity of electric charge accumulated in the electrostatic capacity only, the present invention controls the electric current flow of the source-drain channels owing to the electric field effect from the change in the quantity of electric charge of the floating gate and at the same time generates an effect of self-amplification owing to infinite supply of electric charges through the drain.

The unit pixel and the tunnel junction photo detector described in the above embodiments can be realized in a PPS type, which does not need to have a separate amplification device inside the unit pixel, unlike the conventional CIS.

Moreover, through the above structure, it is possible to realize a high-sensitivity/high-speed image sensor through the standard CMOS process.

Since there is little or no parasitic capacitor compared to the output current of the photo detector inside the pixel, the image sensor having the configuration described above does not require any integration action until a pixel is selected by a row decoder. Therefore, it becomes possible to develop a high-speed frame image sensor by multi-processing a signal in a modified rolling shutter method as well.

Since the unit pixel has a very simple structure and is not big, ultrahigh-speed images of 500-10,000 fps can be realized by forming a capacitor inside the unit pixel like the global shutter method, storing data simultaneously in an analog memory and reading the data in high speed.

The above description has been provided in illustrative purposes only, and it shall be appreciated that it is possible for any ordinarily skilled person in the art to which the present invention pertains to easily modify the present invention without departing the technical ideas and essential features of the present invention. As used herein, the term "aspect" may be used interchangeably with the term "embodiment."

Therefore, it shall be appreciated that the embodiments described above are illustrative, not restrictive. For instance, any elements described to be combined can be also embodied by being separated, and likewise, any elements described to be separated can be also embodied by being combined.

The scope of the present invention shall be defined not by the above description but rather by the claims appended below, and it shall be understood that all possible permutations or modifications that can be contrived from the meanings, scopes and equivalents of the claims are included in the scope of the present invention.

What is claimed is:

1. A unit pixel of an image sensor configured to transform absorbed light to an electrical signal, comprising:
    a photo detector configured to cause an electric current to flow using a change in the quantity of electric charge caused by incident light;
    a select device configured to output the electric current generated by the photo detector to a unit pixel output terminal,
    wherein the photo detector comprises: a light-absorbing part formed in a floated structure and configured to absorbed light; an oxide film being in contact with one surface of the light-absorbing part; a source being in contact with one side of the other surface of the oxide film and separated from the light-absorbing part with the oxide film therebetween; a drain facing the source so as to be in contact with the other side of the other surface of the oxide film and separated from the light-absorbing part with the oxide film therebetween; and a channel formed between the source and the drain and configured to form flow of an electric current between the source and drain,
    wherein the select device comprises: a drain being connected with the source of the photo detector; a source being accessed to the unit pixel output terminal; and a gate configured to receive a control signal from an outside source, and a switching operation is performed based on the control signal,
    wherein the light-absorbing part is doped with first type impurities, and the source and the drain and the photo detector are doped with second type impurities,
    wherein the light-absorbing part is insulated from the source and the drain of the light-absorbing part by the oxide film, and
    wherein electrons of electron-hole pairs generated by the absorbed light are moved to the source and the drain by a tunneling phenomenon occurred by an electric field concentrated in the oxide film, and the flow of the electric current of the channel is controlled by a change in the quantity of electric charge of the light-absorbing part caused by the moving of the electrons.

2. The unit pixel of claim 1, wherein the photo detector is realized in an LDD (light doped drain) structure.

3. The unit pixel of claim 1, wherein the source of the photo detector and the drain of the select device are formed in a same active area.

4. The unit pixel of claim 1, further comprising a second photo detector serially connected with the photo detector and the select device and formed in a same structure as the photo detector.

5. The unit pixel of claim 1, further comprising a second photo detector connected in parallel with the photo detector and formed in a same structure as the photo detector.

6. A unit pixel of an image sensor configured to transform absorbed light to an electrical signal, comprising:
    a photo detector configured to cause an electric current to flow using a change in the quantity of electric charge caused by incident light; and
    a select device configured to output the electric current generated by the photo detector to a unit pixel output terminal,
    wherein the photo detector comprises: a light-absorbing part configured to absorb light by being formed in a floated structure; an oxide film being in contact with one surface of the light-absorbing part; a control terminal formed on the other surface of the light-absorbing part and configured to transfer a reset signal to the light-absorbing part; a source being in contact with one side of the other surface of the oxide film and separated from the light-absorbing part with the oxide film therebetween; a drain facing the source so as to be in contact with the other side of the other surface of the oxide film and separated from the light-absorbing part with the oxide film therebetween; and a channel interposed between the source and the drain and configured to form flow of an electric current between the source and the drain, wherein the select device comprises: a drain being connected with the source of the photo detector; a source being accessed to the unit pixel output terminal; and a gate configured to receive a control signal from an outside, and a switching operation is performed based on the control signal, wherein the light-absorbing part is doped with first type impurities, and the source and the drain the photo detector are doped with second type impurities, wherein the light-absorbing part is insulated from the source and the drain of the light-absorbing part by the oxide film, wherein electrons of electron-hole pairs generated by the absorbed light are moved to the source and the drain by a tunneling phenomenon occurred by an electric field concentrated in the oxide film, and the flow of the electric current of the channel is controlled by a change in the quantity of electric charge of the light-absorbing part caused by the moving of the electrons, and wherein the control terminal moves remaining electric charge by transmitting the reset signal to the light-absorbing part.

7. The unit pixel of claim 6, wherein the photo detector is realized in an LDD (light doped drain) structure.

8. The unit pixel of claim 6, wherein the source of the photo detector and the drain of the select device are formed in a same active area.

* * * * *